(12) United States Patent
Nuebel et al.

(10) Patent No.: US 7,968,988 B2
(45) Date of Patent: Jun. 28, 2011

(54) POWER SEMICONDUCTOR MODULE HAVING A THERMALLY CONDUCTIVE BASE PLATE ON WHICH AT LEAST FOUR SUBSTRATES ARE ARRANGED IN AT LEAST ONE SINGLE ROW

(75) Inventors: Thomas Nuebel, Warstein (DE); Oliver Schilling, Warstein (DE); Reinhold Spanke, Bestwig (DE)

(73) Assignee: Infineon Technologies AG, Munich (DE)

( * ) Notice: Subject to any disclaimer, the term of this patent is extended or adjusted under 35 U.S.C. 154(b) by 493 days.

(21) Appl. No.: 11/680,881

(22) Filed: Mar. 1, 2007

(65) Prior Publication Data

US 2007/0205500 A1    Sep. 6, 2007

Related U.S. Application Data

(63) Continuation of application No. PCT/EP2005/005505, filed on May 20, 2005.

(30) Foreign Application Priority Data

Sep. 1, 2004  (DE) .......................... 10 2004 042 367

(51) Int. Cl.
   *H01L 23/02* (2006.01)
(52) U.S. Cl. .. 257/685; 257/706; 257/712; 257/E25.031
(58) Field of Classification Search .................. 257/685, 257/723, 675, 706, 712, E25.031, E21.614, 257/E25.021, E25.027, E25.032, E23.042, 257/E25.006, E25.013, 726
See application file for complete search history.

(56) References Cited

U.S. PATENT DOCUMENTS

| 5,508,560 | A | 4/1996 | Koehler et al. | 257/730 |
| 5,617,293 | A * | 4/1997 | Schulze et al. | 361/715 |
| 6,235,555 | B1 * | 5/2001 | Cho | 438/112 |
| 2002/0076966 | A1 * | 6/2002 | Carron et al. | 439/330 |
| 2004/0164388 | A1 | 8/2004 | Stolze | 257/678 |

FOREIGN PATENT DOCUMENTS

| DE | 43 38 107 C1 | 3/1995 |
| DE | 101 39 287 A1 | 3/2003 |

(Continued)

OTHER PUBLICATIONS

German Office Action for German Application No. 10 2004 042 367.9 (3 pages), Nov. 24, 2004.

(Continued)

*Primary Examiner* — A. Sefer
*Assistant Examiner* — Dilinh P Nguyen
(74) *Attorney, Agent, or Firm* — Coats & Bennett, P.L.L.C.

(57) ABSTRACT

The power semiconductor module (1) has a heat-conducting base plate (11) on which at least three substrates (2, 3, 4, 5, 6, 7) are placed, each substrate supporting at least one power semiconductor component (8, 9) that gives off heat generated during operation. In order to optimize a power semiconductor module of this type with regard to mechanical load and heat dissipation, the substrates (2, 3, 4, 5, 6, 7) are placed on the base plate (11) while being arranged in a single row (12), and pressing devices (15, 16), which are situated close to the substrate, are provided on both longitudinal sides (11*a*, 11*b*) of the base plate (11) while being arranged parallel to the row (12). The base plate can be pressed against a cooling surface by the pressing devices.

17 Claims, 2 Drawing Sheets

FOREIGN PATENT DOCUMENTS

| | | |
|---|---|---|
| DE | 101 42 971 A1 | 3/2003 |
| DE | 102 31 219 C1 | 5/2003 |
| EP | 0 584 668 A1 | 3/1994 |
| EP | 1 083 599 A2 | 3/2001 |
| EP | 1 278 296 A1 | 1/2003 |
| JP | 07-326711 A | 12/1995 |
| JP | 08-195471 A | 7/1996 |
| JP | 2003-9546 A | 1/2003 |
| JP | 2004-235175 A | 8/2004 |
| WO | 00/68992 A1 | 11/2000 |
| WO | 03/021680 A2 | 3/2003 |

OTHER PUBLICATIONS

International Search Report and Written Opinion for International Application No. PCT/EP2005/005505 (11 pages), Feb. 7, 2006.
International Preliminary Report on Patentability for International Application No. PCT/EP2005/005505 (7 pages), Mar. 29, 2007.

* cited by examiner

POWER SEMICONDUCTOR MODULE HAVING A THERMALLY CONDUCTIVE BASE PLATE ON WHICH AT LEAST FOUR SUBSTRATES ARE ARRANGED IN AT LEAST ONE SINGLE ROW

CROSS-REFERENCE TO RELATED APPLICATION

This application is a continuation of co-pending International Application No. PCT/EP2005/005505 filed May 20, 2005, which designates the United States, and claims priority to German application number DE 10 2004 042 367.9 filed Sep. 1, 2004.

TECHNICAL FIELD

The invention relates to a power semiconductor module having a thermally conductive base plate on which at least four substrates are arranged, each substrate having at least one power semiconductor device which dissipates operating heat.

BACKGROUND

In semiconductor modules for switching high currents or high power levels (power semiconductor modules below), one or more semiconductor components (also referred to as semiconductor chips below) are usually mounted on substrates which comprise ceramic, for example.

A power semiconductor module having a metallic base plate is evident from EP 0 584 668 A1. A plurality of substrates which are electrically insulated from the base plate by means of an interposed insulating layer are symmetrically applied to the base plate. A plurality of power semiconductors which are electrically connected in parallel are symmetrically arranged on the conductor tracks of said substrates. The base plate can be pressed onto a cooling area (not described in any more detail) for the purpose of dissipating heat.

EP 0 584 668 A1 attends to the problem of asymmetrical parasitic inductances in the case of current paths which are not the same. A construction of semiconductor arrangements on separate substrates, their mounting on a common base plate and their optimal cooling are not addressed.

It is increasingly customary to arrange power semiconductors on separate substrates, to mount the latter on a common base plate and to cool them using the base plate. In the case of the substrate arrangement which can be gathered from EP 0 584 668 A1, a very inhomogeneous distribution of the pressing-on pressure between the base plate and the corresponding cooling area would result. It is conceivable to even out a pressing-on pressure produced in the edge region of the substrates by pressing-on apparatuses by means of a convex shape of the underside of the base plate over the entire base plate. However, a convex configuration of the underside of the base plate is complicated, and thus expensive, in terms of production technology and results in mechanical stresses in the base plate when mounted.

SUMMARY

The mechanical load on, and the heat dissipation of, a power semiconductor module having a base plate and at least four substrates which are mounted on the latter and have power semiconductors can be optimized.

According to an embodiment, a power semiconductor module may have a thermally conductive base plate on which at least four substrates are arranged, each substrate having at least one power semiconductor device which dissipates operating heat, the substrates being arranged on the base plate in a single row, and pressure-exerting apparatuses which can be used to press the base plate onto a cooling area being provided on both longitudinal sides of the base plate parallel to the row and close to the substrate.

BRIEF DESCRIPTION OF THE DRAWINGS

The invention will be explained by way of example in further detail below with reference to a drawing, in which.

DETAILED DESCRIPTION

The power semiconductor module according to an embodiment, thus, comprises four or more substrates to which at least one semiconductor component is respectively connected. For their part, according to an embodiment, these substrates are in highly thermally conductive contact with the top side of the base plate.

According to an embodiment, the substrates may be arranged in only one row. This makes it possible for the pressure-exerting apparatuses to act on the base plate relatively close to the substrate. According to an embodiment, spring-loaded connecting elements or else through-holes for mounting screws are suitable, for example, as the pressure-exerting apparatuses.

According to an embodiment, the pressure-exerting apparatuses provided on both longitudinal sides of the base plate parallel to the row of substrates can therefore press the base plate onto a suitable cooling area in a particularly homogeneous manner and with little stress. According to an embodiment, the cooling area may be, for example, a surface of an air-cooled or liquid-cooled heat sink.

According to an embodiment, the underside of the base plate can thus be planar; this is because it does not need to compensate for the distances between the pressure-exerting apparatuses and the substrates or the heat-generating power semiconductors of the latter, or at least does not need to compensate for the latter to such a great extent, since these distances can be considerably shorter in any case than in the configuration described at the outset. A module which is considerably more convenient to produce but nevertheless ensures improved heat dissipation from the power semiconductors to the cooling area is thus provided.

According to an embodiment, a plurality of power semiconductors may preferably be electrically connected in parallel on each substrate, and the power semiconductor circuits constructed in this manner on the substrates may likewise be electrically connected in parallel. Particularly high currents may thus be switched. Circuit variants which are known per se, for example individual switches, dual switches or full-bridge circuits, may be implemented on the substrates, according to an embodiment, using the substrate layout or by means of appropriate connection.

Further advantageous refinements according to further embodiments provide for the substrates to have an essentially square shape, and for a pressure-exerting apparatus to be provided in the region of each corner of the substrate and/or for pressure-exerting apparatuses which are close to the edge and are opposite one another to be respectively provided in the central region of the substrate longitudinal edges. The pressure forces are thus introduced in a particularly uniform manner, which ensures a low and homogeneous mechanical load on the base plate and on the substrates when there is minimized thermal resistance toward the cooling area.

Figure 1:
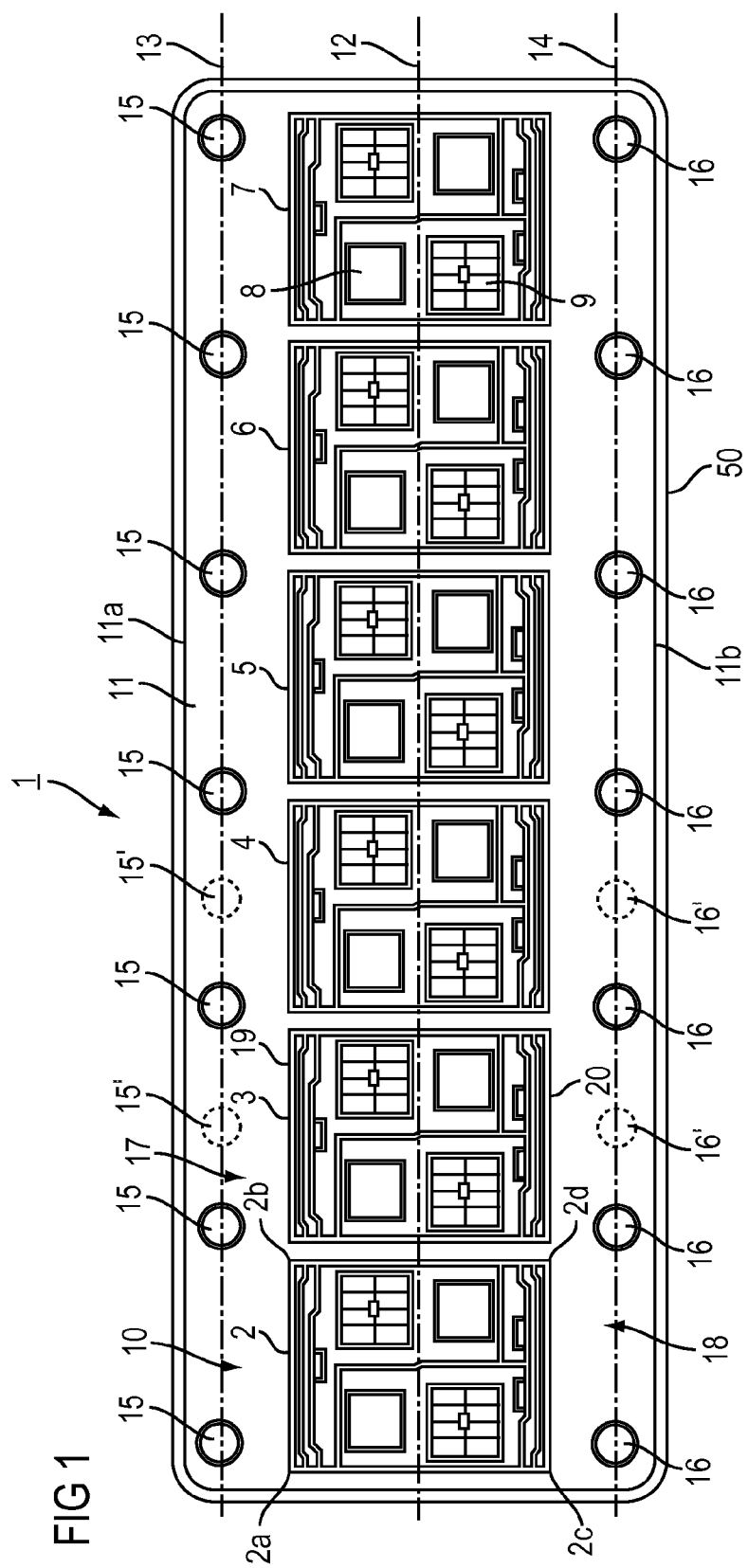
FIG. 1: shows a plan view of a power semiconductor module.

FIG. 1 shows a power semiconductor module 1 having a total of six electrically insulating substrates 2, 3, 4, 5, 6, 7. The substrates have an essentially identical layout, a plurality of semiconductor components in the form of semiconductor chips (for example 8, 9) being arranged on each substrate and being electrically connected by means of bonding wires (not illustrated). For their part, the substrates are electrically connected in parallel in a manner not shown in any more detail.

The substrates are mounted on the top side 10 of a common base plate 11 comprising copper or a metallic composite material (for example AlSiC) and in the process are arranged in a single row 12. On its longitudinal sides 11a, 11b, the base plate 11 has pressing-on apparatuses, which are implemented in the form of holes 15, 16 which are regularly spaced apart, in two rows 13, 14 which run close to the substrate. Screws (not shown) which can be used to screw the power semiconductor module to the surface of a heat sink 50 pass through said holes.

It can be seen that the substrates have an essentially rectangular shape and are placed in such a manner, and the holes are produced in such a manner, that a hole 15, 16 is situated in the region of each corner of the substrate (for example 2a, 2b, 2c, 2d). As indicated only by way of example for the substrates 3 and 4, holes 15', 16' may alternatively or additionally also be provided in the respective central region (for example 17, 18 of the substrate 3) of the respective longitudinal edge 19, 20 of the substrate 3. It is thus ensured that the pressing-on forces and thus the pressing-on pressure produced by the screws which pass through the holes 15, 16 and 15', 16' are introduced close to the substrate.

Figure 2:
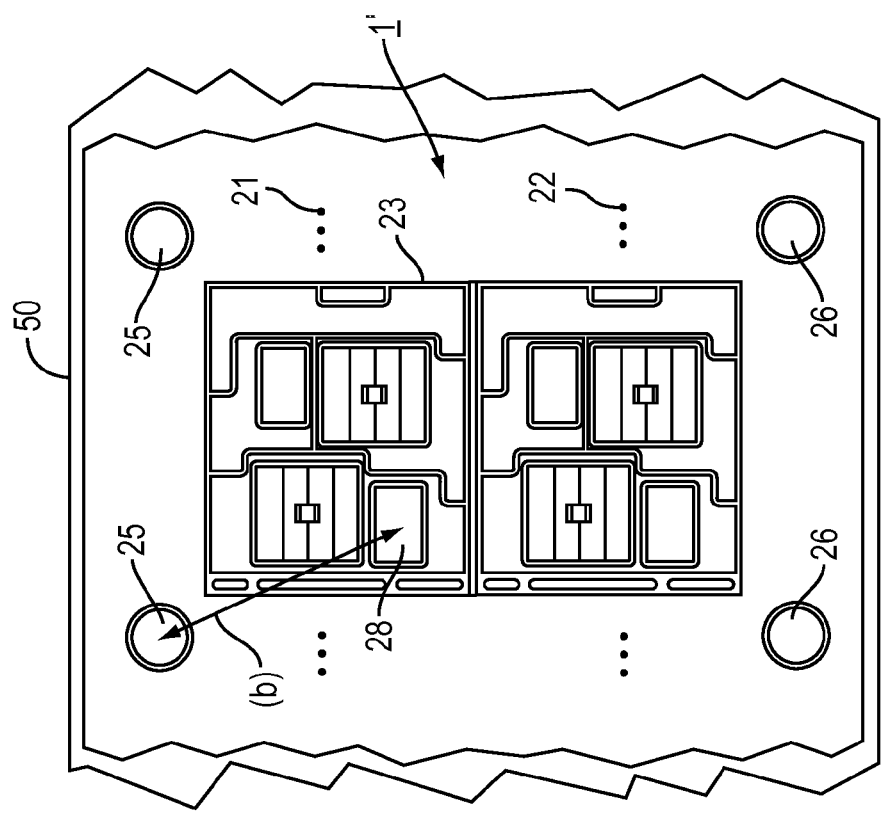
FIG. 2: shows distances which are relevant to heat conduction in the case of a multi-row power semiconductor module in comparison with a module.
Figure 2:
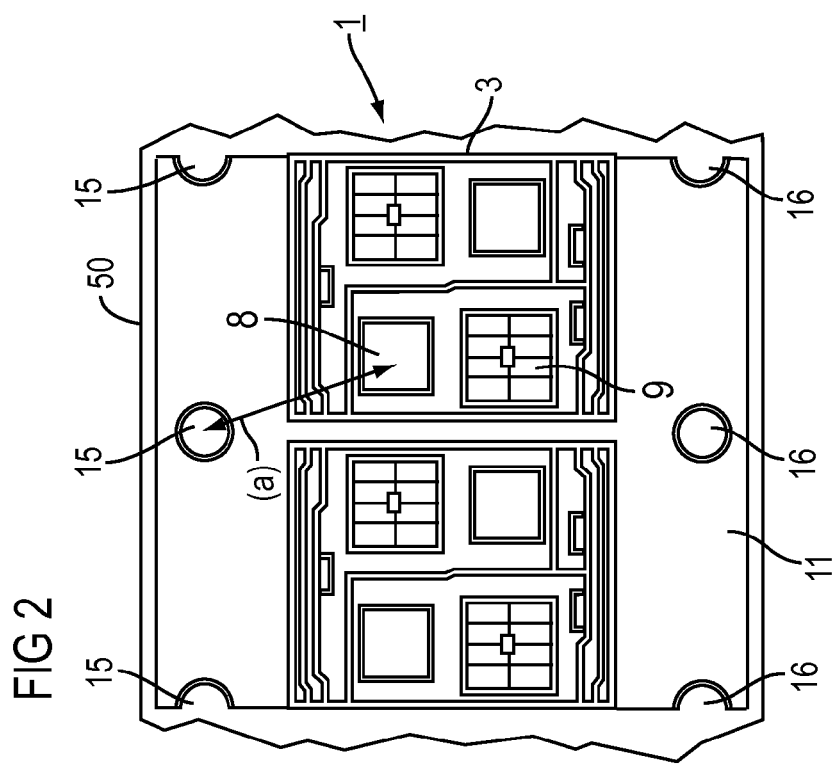

FIG. 2 diagrammatically shows some of the proportions in a power semiconductor module 1 according to an embodiment (left-hand part) and in a module 1' having substrates, which are arranged in two rows 21, 22 (right-hand part), and two corresponding rows of pressing-on apparatuses 25, 26. It can be seen that the comparable distances (a) and (b) between a respective pressing-on apparatus 15 or 25 and a heat-producing semiconductor chip 8, 28 on an approximately identical substrate 3, 23 vary considerably. In the power semiconductor module according to an embodiment, the relevant distance (a) is only approximately 70% of the corresponding distance (b) in the power semiconductor module 1' in which the substrates are arranged in two rows. This is the reason why the pressing-on forces produced by the pressing-on apparatuses are introduced in a considerably improved manner and why the mechanical load on the base plate and on the substrates is considerably reduced.

LIST OF REFERENCE SYMBOLS

1 Power semiconductor module
1' Module
2, 3, 4, 5, 6, 7 Substrate
2a, 2b, 2c, 2d Corner of the substrate
8, 9 Semiconductor chip
10 Top side
11 Base plate
11a, 11b Longitudinal side
12 Row
13, 14 Row
15, 16 Hole (pressing-on apparatus)
15', 16' Hole (pressing-on apparatus)
17, 18 Central region
19, 20 Longitudinal edge
21, 22 Row
23 Substrate
25, 26 (Hole) pressing-on apparatus
28 Power semiconductor
(a), (b) Distance

What is claimed is:

1. A power semiconductor module having
  a thermally conductive base plate on which at least four substrates are arranged, each substrate having at least one power semiconductor device which dissipates operating heat, the substrates being arranged on the base plate in exactly one single row, and
  two sets of pressure-exerting apparatuses which can be used to press the base plate onto a cooling area being provided on both longitudinal sides of the base plate parallel to the exactly one single row, wherein the pressure-exerting apparatuses of each of the sets are arranged along one of the longitudinal sides of the base plate and in a row parallel to the at least one single row, wherein at least three of the pressure-exerting apparatuses are disposed along one of the longitudinal sides of the base plate, and wherein at least one of the pressure-exerting apparatuses of the respective set is arranged outside corner regions of the base plate.

2. The power semiconductor module as claimed in claim 1, wherein the substrates have an essentially square shape, and the base plate is equipped with one of the pressure-exerting apparatuses provided in the region of each corner of the substrate.

3. The power semiconductor module as claimed in claim 1, wherein the pressure-exerting apparatuses which are close to a longitudinal edge of a substrate and are opposite one another respectively are provided in a central region of the substrate longitudinal edges.

4. The power semiconductor module as claimed in claim 1, wherein said pressure-exerting apparatuses are holes through which screws are mounted to fix said thermally conductive base plate against the cooling area.

5. The power semiconductor module as claimed in claim 1, wherein each pair of longitudinally offset pressure-exerting apparatuses is arranged on the base plate so that a line extending perpendicular to a longitudinal center line of the thermally conductive base plate passes through at least one of the substrates and both pressure-exerting apparatuses of the pair.

6. The power semiconductor module as claimed in claim 1, wherein each one of the substrates is bordered by a different set of the pressure-exerting apparatuses with each set including at least two pairs of longitudinally offset ones of the pressure-exerting apparatuses.

7. The power semiconductor module as claimed in claim 1, wherein the at least one of the pressure-exerting apparatuses of the respective set arranged outside the corner regions of the base plate is disposed along one of the longitudinal sides of the base plate.

8. A power semiconductor module comprising
  at least four substrates each comprising a power semiconductor device arranged in exactly one single row on a thermally conductive base plate, and
  two sets of holes arranged on said base plate through which the base plate is mounted onto a cooling area, wherein the holes of each of the sets are arranged along a longitudinal side of the base plate and in a row parallel to the single row, wherein at least three of the holes are disposed along one of the longitudinal sides of the base plate, and wherein at least one of the holes of the respective set is arranged outside corner regions of the base plate.

9. The power semiconductor module as claimed in claim 8, wherein the substrates have an essentially square shape, and the base plate is equipped with one of the holes provided in the region of each corner of the substrate.

10. The power semiconductor module as claimed in claim 8, wherein the holes which are close to a longitudinal edge of a substrate and are opposite one another, respectively are provided in a central region of the substrate longitudinal edges.

11. The power semiconductor module as claimed in claim 8, wherein each pair of longitudinally offset holes is arranged on the base plate so that a line extending perpendicular from a longitudinal center line of the thermally conductive base plate passes through one of the substrates and both holes of the pair.

12. A power semiconductor module comprising
a heat sink,
a thermally conductive base plate onto which at least four substrates each comprising a power semiconductor device are arranged in exactly one single row,
wherein the thermally conductive base plate comprises two sets of holes arranged on both longitudinal sides of the base plate in parallel to the row, and connecting elements which mount said thermally conductive base plate to said heat sink through said holes,
wherein at least three of the holes are disposed along one of the longitudinal sides of the base plate, and
wherein at least one of the holes of the respective set is arranged outside corner regions of the base plate.

13. The power semiconductor module as claimed in claim 12, wherein the substrates have an essentially square shape, and the base plate is equipped with one of the holes provided in the region of each corner of the substrate.

14. The power semiconductor module as claimed in claim 12, wherein the holes which are close to a longitudinal edge of a substrate and are opposite one another, respectively are provided in a central region of the substrate longitudinal edges.

15. The power semiconductor module as claimed in claim 12, wherein each pair of longitudinally offset holes is arranged on the base plate so that a line extending perpendicular from a longitudinal center line of the thermally conductive base plate passes through at least one of the substrates and both holes of the pair.

16. The power semiconductor module as claimed in claim 12, wherein each one of the substrates is bordered by a different set of the holes with each set including at least two pairs of longitudinally offset ones of the holes.

17. The power semiconductor module as claimed in claim 12, wherein the at least one of the holes of the respective set arranged outside the corner regions of the base plate is disposed along one of the longitudinal sides of the base plate.

* * * * *